United States Patent [19]

Tanimura et al.

[11] 4,300,213

[45] Nov. 10, 1981

[54] MEMORY CIRCUIT WITH INCREASED OPERATING SPEED

[75] Inventors: Nobuyoshi Tanimura, Tokyo; Hiroshi Fukuta, Kodaira; Kotaro Nishimura, Kodaira; Tokumasa Yasui, Kodaira, all of Japan

[73] Assignees: Hitachi, Ltd.; Hitachi Ome Electronic Co., Ltd., both of Tokyo, Japan

[21] Appl. No.: 89,745

[22] Filed: Oct. 31, 1979

[30] Foreign Application Priority Data

Nov. 24, 1978 [JP] Japan .................................. 53-144133

[51] Int. Cl.³ .............................................. G11C 7/00
[52] U.S. Cl. ................................................... 365/190
[58] Field of Search ............................... 365/154, 190

[56] References Cited

U.S. PATENT DOCUMENTS

| 4,099,265 | 7/1978 | Abe ..................... | 365/154 |
| 4,162,540 | 7/1979 | Ando .................... | 365/190 |
| 4,168,537 | 9/1979 | Uchida .................. | 365/154 |

*Primary Examiner*—Stuart N. Hecker
*Attorney, Agent, or Firm*—Craig and Antonelli

[57] ABSTRACT

Digit lines, connected to the input and output terminals of a memory cell composed of MISFETs, are coupled to common data lines through a switching circuit which is controlled by a decoder circuit. There is also connected with the digit lines a load which is composed of a plurality of enhancement mode MISFETs connected in series in the diode form. The high level of the signals at the digit lines is lowered by the action of the load means. In response to the reduction in the potentials at the digit lines, the switching means is rendered conductive at an early rise time of control signals. As a result, the operating speed of the memory circuit can be increased.

8 Claims, 17 Drawing Figures

MEMORY CIRCUIT WITH INCREASED OPERATING SPEED

BACKGROUND OF THE INVENTION

1. Field of the Invention

The present invention relates to a memory circuit, and more particularly to a memory circuit which is composed of a insulated gate field effect transistor (which will be hereinafter referred to as "IGFET" or "MISFET").

2. Description of the Prior Art

In a static RAM (Random Access Memory), a plurality of memory cell circuits are arranged in the form of a matrix, in which the plural memory cell circuits in an identical row have their respective selecting terminals connected commonly with one word line whereas the plural memory cell circuits in an identical column have their respective input and output terminals connected commonly with one digit line.

As a result, the row of the memory cell circuits connected with the word line is selected by feeding the output of an X decoder circuit to that particular word line.

The static RAM can be so constructed as to have its plural digit lines coupled to a common data line through switch means (or a column gate) which is controlled by the output of a Y decoder. Then, it is sufficient that a write circuit and a read out circuit are provided for the common data line. According to this system, the circuit construction can be simplified as compared with the case in which the write circuit and the read out circuit are provided for each of the digit line.

Among the plural memory cell circuits of the RAM, the memory cell circuit selected by the output of the X decoder circuit and the output of the Y decoder circuit is connected with the common data line through the digit line and the switch means. Thus, for the memory cell circuit selected, information is written through the common data line, or the information in the selected memory cell circuit is read out through the common data line.

In the memory circuit, moreover, peripheral circuits such as a decoder circuit or an input and output circuit require a somewhat higher minimum supply voltage limit than the memory cell circuit constituting the memory circuit. When the supply voltage is lowered, the peripheral circuits may malfunction so that the information held in the memory cell circuits is lost by erroneous control signals and/or data signals.

On the other hand, the access time of the memory circuit is restricted by the delay in the operation of data transfer means such as the switch means.

SUMMARY OF THE INVENTION

It is therefore an object of the present invention to provide a memory circuit which has a shortened access time.

Another object of the present invention is to provide a memory circuit, in which the signal level at a common data line is quickly varied.

Still another object of the present invention is to provide a memory circuit which is quick in the start of data transfer.

A further object of the present invention is to provide a memory circuit which is equipped with such load means as can be suitably added to a digit line.

A further object of the present invention is to provide a memory circuit which can be satisfactorily operated by a lowered supply voltage.

A further object of the present invention is to provide a memory circuit which is so constructed to prohibit the operations of its peripheral circuits when the supply voltage is further lowered.

A further object of the present invention is to provide a memory circuit which is equipped with a supply voltage detecting circuit which is suitable for controlling the load means or the peripheral circuits.

BRIEF DESCRIPTION OF THE DRAWINGS

Other objects and advantages of the present invention will become apparent from the following description made with reference to the accompanying drawings, in which.

DESCRIPTION OF THE PREFERRED EMBODIMENTS

In a RAM composed of MISFETs, a load means for imparting a load to a selected memory cell circuit is connected between a digit line and a power source. A switch composed of IGFETs, which are controlled by the output of a Y decoder, for acting as a column gate is connected between the digit lines and a common data line.

The switch is not rendered conductive unless the output level of the Y decoder circuit at least exceeds the threshold voltage of the switch means. As a result, the transfer of the data through the switch means is not started until the Y decoder circuit starts its operation so that its output level reaches a preset value.

According to the present invention, the high level at the digit line is lowered by the construction that the load means connected with the digit line is composed of a plurality of enhancement IGFETs connected in series so that the supply voltage is substantially lowered. As a result of the reduction in the high level of the digit line, the switch is rendered conductive even in response to the low output level of the Y decoder circuit. As a result, the data transfer can be accomplished at a high speed. In addition, since the level at the common data line is lowered in response to the reduction in the level at the digit line, a read out circuit made receptive of the signals of the common data line can be operated in high sensitivity, as will be described later.

The present invention will now be described in detail in connected with the embodiments thereof.

Figure 1:
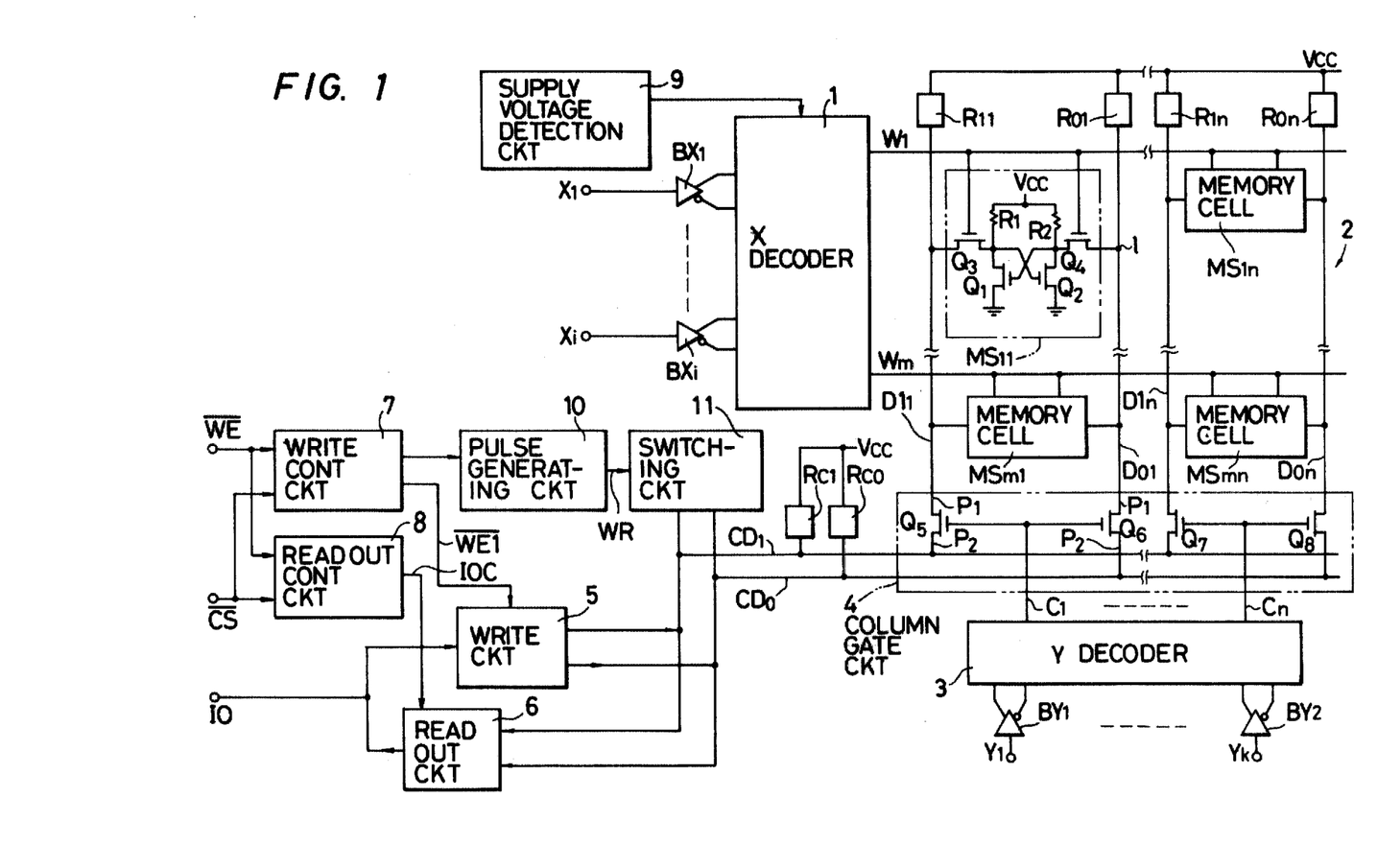
FIG. 1 is a block diagram showing a memory circuit exemplifying the present invention.

FIG. 1 shows a block diagram of a memory circuit exemplifying the present invention.

In FIG. 1, reference numeral 2 indicates a memory matrix, which is composed of a plurality of memory cell circuits $MS_{11}$ to $MS_{mn}$ arranged in the form of a matrix, word lines $W_1$ to $W_m$, and paired digit lines $D1_1$ and $D1_0$ to $D1_n$ and $D0_n$.

Each of the memory cell circuits has a selecting terminal and a pair of input and output terminals, and is composed, as shown for example at $MS_{11}$, of MISFETs $Q_1$ and $Q_2$ constituting a flip-flop circuit, load resistors $R_1$ and $R_2$ therefor, and MISFETs $Q_3$ and $Q_4$ constituting a transmission gate.

Each of the memory cell circuits $MS_{11}$ to $MS_{1n}$ arranged in the same row has its selecting terminal connected commonly with the word line $W_1$ corresponding to that particular row. Each of the memory cell circuits $MS_{11}$ to $MS_{m1}$ arranged in the same column has its input and output terminals connected commonly with the paired digit lines $D1_1$ and $D0_1$ corresponding to that particular column.

Load means $R_{11}$, $R_{01}$, $R_{1n}$ and $R_{0n}$ are connected between the respective digit lines and a supply terminal $V_{cc}$. The load means for each digit line is used for reading information in the memory cell circuits, as will be described later. The load resistances $R_1$ and $R_2$ for each memory cell circuit are made to have relatively high resistances so as to reduce the power consumption of the memory cell circuit during the holding operation, whereas the load means for the digit line is made to have a relatively low resistance for the read out operation.

The respective digit lines are connected with a column gate circuit 4.

This column gate circuit 4 is provided, as shown in FIG. 1, between the respective digit line pairs and common data lines $CD_1$ and $CD_0$ and includes MISFETs $Q_5$ to $Q_8$ acting as transmission gates to be controlled by a Y decoder circuit 3.

An X decoder circuit 1 is supplied with address signals from address input terminals $X_1$ to $X_i$ through address buffer circuits $BX_1$ to $BX_i$, respectively, so that it selects one of the word lines $W_1$ to $W_m$ in accordance with those address signals to thereby raise the signals of the selected word line to a high level. Incidentally, the signals of the remaining word lines unselected are left at a low level.

Similarly to the X decoder circuit, the Y decoder circuit 3 is supplied with address signals from address input terminals $Y_1$ to $Y_k$ through address buffer circuits $BY_1$ to $BY_k$, respectively, so that it selects one of digit selecting lines $C_1$ to $C_n$ thereby to raise the signals thereof to a high level.

When the transmission gate MISFETs of the memory cell circuit in the row selected by the X decoder circuit 1 are rendered conductive, the flip-flop circuit constituting that memory cell circuit is coupled to its corresponding paired digit lines through the transmission gate MISFETs.

The digit lines of the line selected by the Y decoder circuit 3 are coupled to the common data lines through the column gate circuit 4. As a result, the memory cell circuit, which is selected by the X decoder circuit 1 and the Y decoder circuit 3, is connected with the common data line.

In the line selected, the MISFETs $Q_1$ and $Q_2$ of the memory cell circuit uses as its load the load means which is connected with the digit lines. As a result, the potential of the paired digit lines is determined by the information stored in the memory cell circuit. The potential of the common data lines is then determined by the potential of the selected digit lines. The potential of the common data lines, i.e., the information stored in the selected memory cell circuit, is read out by means of a read out circuit 6.

For example, if the potential of the common data line $CD_1$ is raised to a high level whereas the potential of the common data line $CD_0$ is reduced to a low level by the action of a write circuit 5, the MISFET $Q_1$ of the selected memory cell circuit, e.g., $MS_{11}$ is rendered nonconductive by the low level of the common data line $CD_0$ so that the MISFET $Q_2$ is rendered conductive in response to the nonconductive condition of the MISFET $Q_1$. In other words, the information is written in the memory cell circuit selected.

In the present embodiment, the output terminal of the read out circuit 6 and the input terminal of the write circuit 5 are connected commonly with an input and output terminal IO, although the present invention is not specially limited thereto.

The write circuit 5 is controlled by a write control circuit 7 which is made receptive of both chip selecting signals fed from the outside to a chip selecting terminal $\overline{CS}$ and write control signals fed likewise from the outside to a write control terminal $\overline{WE}$. The read out circuit 6 is controlled by a read out control circuit 8 which is made receptive of similar signals.

The memory circuit shown in FIG. 1 is brought into its stand-by and selecting conditions in response to the low and high levels of the chip selecting signals at the terminal $\overline{CS}$ (Incidentally, the chip selecting signals themselves will be denoted as "$\overline{CS}$".), respectively. Moreover, the memory circuit is also brought into its write and read out conditions in response to the low and high levels of the write control signals $\overline{WE}$ upon the chip selection, respectively.

Figure 4:
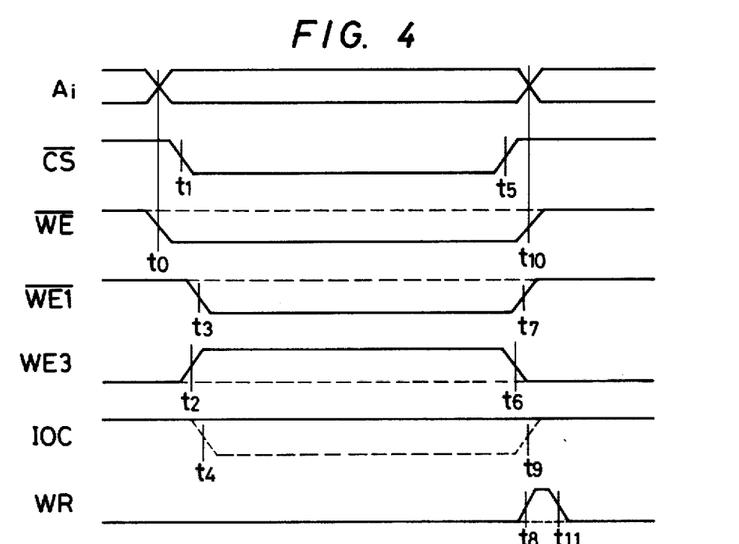
FIG. 4 is a timing chart of the memory circuit of FIG. 1.

FIG. 4 shows an example of the timing chart of the memory circuit of FIG. 1. In FIG. 4, solid lines indicate the case of the write operations whereas broken lines indicate the case of the read out operations.

In the write operations, the address input to be fed to the X address input terminals $X_1$ to $X_i$ and to the Y address input terminals $Y_1$ to $Y_k$ is renewed at time t0. The write control signals $\overline{WE}$ are changed from a high level to a low level although the change need not always take place in synchronism with that time t0.

At time t1, the chip selecting signals $\overline{CS}$, which have been at a high level while the chip is not selected, are changed to a low level. Since, in these ways, the chip selecting signals $\overline{CS}$ and the write control signals $\overline{WE}$ take their low levels, the output signals $\overline{WE1}$ of the write control circuit 7 are changed from a high level to a low level at slightly delayed time t3. When the output signals $\overline{WE1}$ take their low level, the write circuit 5 starts its operations.

Since the chip selecting signals $\overline{CS}$ are returned from the low level to the high level at time t5, the output signals $\overline{WE1}$ of the write control circuit 7 are also returned from the low level to the high level at time t7.

At time t10, the write control signals WE are returned from the low level to the high level. In the meantime, the output signals IOC of the read out control circuit 8 are held at a high level, as shown in FIG. 4, by the write control signals $\overline{WE}$ at their low level.

In response to the low level of the chip selecting signals $\overline{CS}$ and to the high level of the write control signals $\overline{WE}$, the memory circuit starts its read out operation.

When the chip selecting signals $\overline{CS}$ take the low level at the time t1, the output signals IOC of the read out control circuit 8 are changed in response thereto from the high level to the low level at time t4 so that the read out circuit 6 starts its read out operations.

Since the chip selecting signals $\overline{CS}$ restore the high level at the time t5, the output signals IOC also restore the high level at time t9 so that the read out circuit 6 interrupts its operations.

Figure 5:
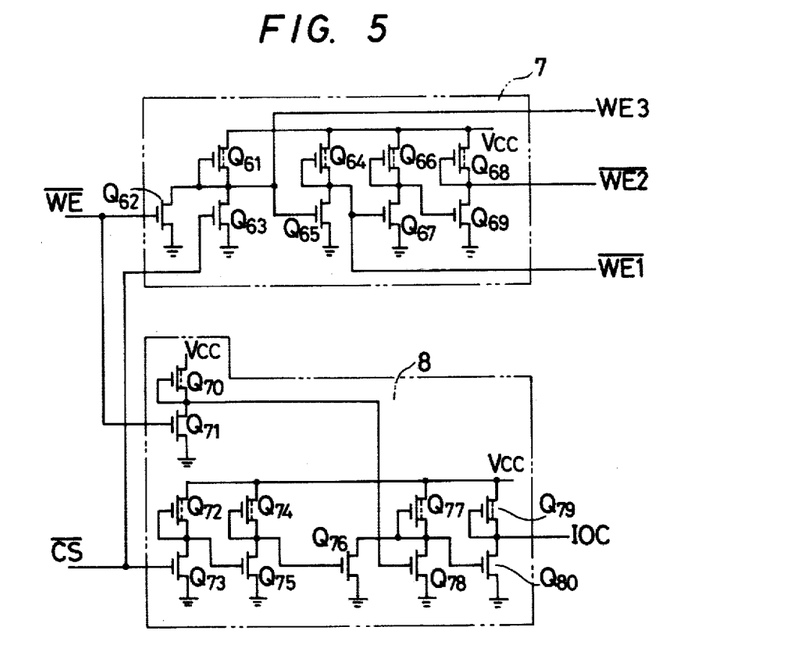
FIG. 5 is a circuit diagram showing in detail the blocks 7 and 8 of FIG. 1.

Although not limited to special constructions, the write control circuit 7 and the read out circuit 8 may be embodied to have such constructions as are shown in FIG. 5.

The write control circuit 7 is composed of a NOR gate circuit consisting of MISFETs $Q_{61}$ to $Q_{63}$ and three inverter circuits respectively consisting of MISFETs $Q_{64}$ and $Q_{65}$, $Q_{66}$ and $Q_{67}$, and $Q_{68}$ and $Q_{69}$. The outputs $\overline{WE1}$ and $\overline{WE2}$ of the write control circuit 7 are used to control the operations of the write circuit 5. The remaining output $\overline{WE3}$ is used to control the operations of a pulse generating circuit 10, which will be described later.

On the other hand, the read out control circuit 8 is composed of four inverter circuits respectively consisting of MISFETs $Q_{70}$ and $Q_{71}$, $Q_{72}$ and $Q_{73}$, $Q_{74}$ and $Q_{75}$, and $Q_{79}$ and $Q_{80}$, and a NOR gate circuit consisting of MISFETs $Q_{76}$ to $Q_{78}$. The output IOC of the read out control circuit 8 thus constructed is used to control the operations of the read out circuit 6.

Incidentally, the MISFETs $Q_{61}$, $Q_{64}$, and so on, are of the depletion type and are indicated differently from the enhancement type MISFETs in as $Q_{62}$ or $Q_{63}$ such that a broken like is drawn between the source and drain thereof, as shown.

Figure 2:
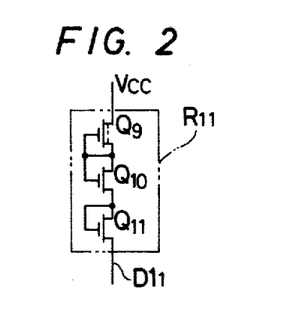
FIG. 2 is a circuit diagram showing in detail the block $R_{11}$ of FIG. 1.

FIG. 2 shows one concrete circuit of the load means $R_{11}$ which is connected with the digit line $D_{11}$ of the circuit shown in FIG. 1. The other load means such as $R_{01}$ may have the same construction as the load means $R_{11}$.

The load means $R_{11}$ is constructed, as shown, of the series connection of the MISFET $Q_9$ of depletion type, in which the gate and source are connected, and the MISFETs $Q_{10}$ and $Q_{11}$ of enhancement type, in which the gate and drain are connected in the diode form. Even if the current fed to the digit line $D_{11}$ is substantially zero, the load means $R_{11}$ will generate the voltage drop $2V_{th}$ which is determined by the threshold voltage $V_{th}$ of the two enhancement type MISFETs $Q_{10}$ and $Q_{11}$. As a result, the high level of the signals at the digit line $D_{11}$ is limited to $V_{cc} - 2V_{th}$ (wherein the letter $V_{cc}$ indicates the supply voltage). On the other hand, the MISFET $Q_9$ exhibits constant current characteristics because its gate and source are connected. As a result, the depletion type MISFET $Q_9$ is used to restrict the current to flow from the load means $R_{11}$ to the digit line $D_{11}$ when information is to be written in the memory cell circuit.

Figure 6:
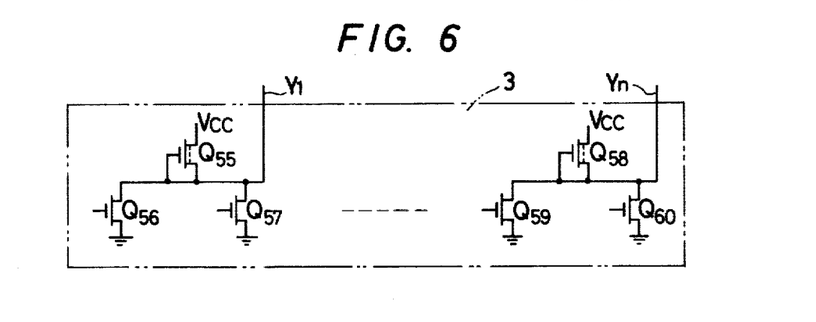
FIG. 6 is a circuit diagram showing in detail the block 3 of FIG. 1.

FIG. 6 shows a concrete construction of the Y decoder circuit 3 shown in FIG. 1.

The Y decoder circuit 3 is composed of a plurality of NOR gate circuits, as shown. The NOR gate circuit having an output line $Y_1$ is composed of a depletion type load MISFET $Q_{55}$ and enhancement type input MISFETs $Q_{56}$ and $Q_{57}$.

Figure 7:
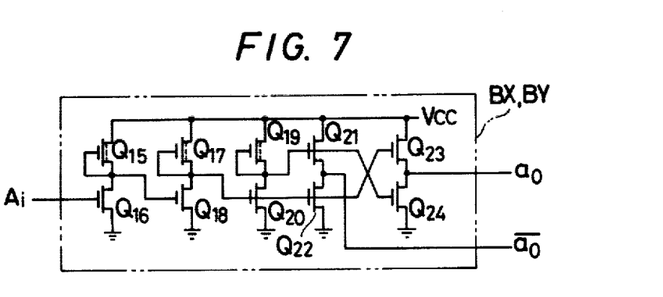
FIG. 7 is a circuit diagram showing in detail the blocks BX and BY of FIG. 1.

The gates of the input MISFET $Q_{56}$ and $Q_{57}$, are selectively fed with the outputs of the plural address buffers, each of which is made responsive to an address input $A_i$ to generate non-inverted signals $a_0$ and inverted signals $\overline{a_0}$, as shown in detail in FIG. 7. If at least one of the gate inputs of the MISFETs $Q_{56}$ and $Q_{57}$ is at a high level, the signals at the non-selecting or low level are generated at the output line $Y_1$. When, on the contrary, all the input gates are at the low level, the signals at a selecting or high level are generated at the output line $Y_1$. Since, in this instance, the voltage drop due to the threshold voltage, as is established in the enhancement type MISFETs, is not invited in the depletion type load MISFET $Q_{55}$, the high level of the output signals of the Y decoder circuit can substantially reach the supply voltage $V_{cc}$.

Figure 8:
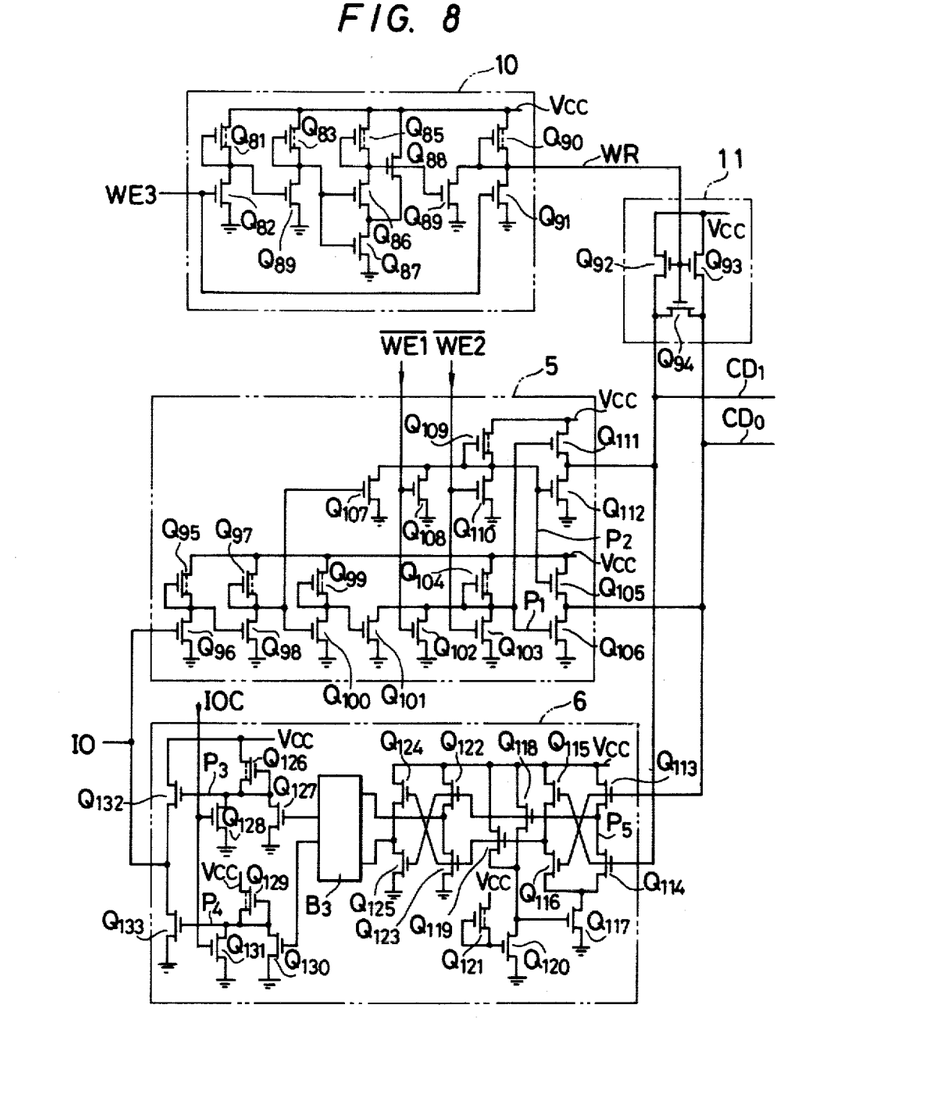
FIG. 8 is a circuit diagram showing in detail the blocks 5, 6, 10 and 11 of FIG. 1.

FIG. 8 shows the concrete constructions of the write circuit 5 and the read out circuit 6 as well as a pulse generating circuit 10 and a switching circuit 11, which will be described later.

The write circuit 5 is composed of three inverter circuits respectively consisting of MISFETs $Q_{95}$ and $Q_{96}$, $Q_{97}$ and $Q_{98}$ and $Q_{99}$ and $Q_{100}$, two NOR gates respectively consisting of MISFETs $Q_{101}$ to $Q_{104}$ and $Q_{107}$ to $Q_{110}$, and two push-pull output circuits respectively consisting of MISFETs $Q_{105}$ and $Q_{106}$ and $Q_{111}$ and $Q_{112}$. The MISFET $Q_{96}$ has its gate connected with the input and output terminal IO whereas the MISFETs $Q_{102}$ and $Q_{108}$ have their gates connected with the output line $\overline{WE1}$ of the write control circuit 7 shown in FIG. 5. On the other hand, the MISFETs $Q_{103}$ and $Q_{104}$ have their gates connected with the outout line $\overline{WE2}$ of the aforementioned write control circuit 7 shown in FIG. 5. Moreover, the MISFETs $Q_{105}$ and $Q_{106}$ constituting the push-pull output circuit have their respective source and drain connected with the common data line $CD_0$ whereas the MISFETs $Q_{111}$ and $Q_{112}$ constituting the push-pull output circuit have their respective source and drain connected with the other common data line $CD_1$.

The signals at the output lines $\overline{WE1}$ and $\overline{WE2}$ are at the low levels only during the chip selecting period for the writing purpose, i.e., while the chip selecting signals $\overline{CS}$ and the write control signals $\overline{WE}$ are at their low levels. During that writing period, in accordance with the nonconductive conditions of the MISFETs $Q_{102}$, $Q_{103}$, $Q_{108}$ and $Q_{110}$, there appear such signals of opposite phases at the output terminals $P_1$ and $P_2$ of the aforementioned two NOR gates in accordance with the signal level at the input and output terminal IO. In response to the outputs $P_1$ and $P_2$ of the two NOR gates, moreover, signals of opposite phases also appear at the output terminals of the two push-pull output circuits. More specifically, if the signals at the input and output terminal IO are at the high level, one of the push-pull output circuits raises the common data line $CD_1$ to the high level whereas the other push-pull output circuit lowers the common data line $CD_0$ to the low level.

If, on the contrary, the signals at the terminal IO are at the low level, the signals at the common data line $CD_1$ are lowered to the low level whereas the signals at the other common data line $CD_0$ are raised to the high level.

During the chip selecting period for the reading operation and during the chip non-selecting period, the signal levels of the output lines $\overline{WE1}$ and $\overline{WE2}$ are high whereas the output signal levels of the two NOR gates are low irrespective of the signal levels of the input and output terminal IO. During these periods, since all the MISFETs $Q_{105}$, $Q_{106}$, $Q_{111}$ and $Q_{112}$ are under their nonconductive conditions, the two push-pull output circuits make their outputs floating.

On the other hand, the read out circuit 6 is composed of a first stage differential circuit consisting of MISFETs $Q_{113}$ to $Q_{121}$, a second stage differential circuit consisting of MISFETs $Q_{122}$ to $Q_{125}$, a third stage differential circuit $B_3$ having the same construction as that of the second stage differential circuit, two NOR gates respectively consisting of MISFETs $Q_{126}$ to $Q_{128}$ and $Q_{129}$ to $Q_{131}$, and a push-pull output circuit consisting of MISFETs $Q_{132}$ and $Q_{133}$. In the first stage differential circuit, the MISFET $Q_{120}$ having its gate biased through the MISFET $Q_{121}$ acts as a source load upon the MISFETs $Q_{118}$ and $Q_{129}$. The MISFET $Q_{117}$ generates a drain current in accordance with the source outputs of the MISFETs $Q_{118}$ and $Q_{119}$. By the negative feedback action of the circuit consisting of the MISFETs $Q_{117}$ to $Q_{121}$, the output level of the first stage differential circuit is controlled to a substantially constant level.

The output line IOC of the read out control circuit 8 is at the low level during the chip selecting period for the reading purpose. During this period, since the MISFETs $Q_{128}$ and $Q_{131}$ of FIG. 8 are under their nonconductive conditions, there are generated at the output terminals $P_3$ and $P_4$ of the two NOR gates such signals of opposite phases in accordance with the levels at the common data lines $CD_1$ and $CD_0$. In response to the outputs $P_3$ and $P_4$ of the NOR gates, there appear signals at the push-pull circuits. More specifically, for example, if the common data line $CD_1$ is at the high level whereas the other common line $CD_0$ is at the low level, the output circuit consisting of the MISFETs $Q_{132}$ and $Q_{133}$ generates signals of the high level. If, on the contrary, both of the common data lines $CD_1$ and $CD_0$ are at their low levels, that particular output circuit generates signals of the low level.

During the chip selecting period for the writing purpose and during the chip non-selecting period, consequently, the signals at the output line IOC are at the high level so that the MISFETs $Q_{128}$ and $Q_{131}$ are rendered conductive. As a result, the outputs $P_3$ and $P_4$ of the two NOR gates of the circuit 6 take their low levels irrespective of the signal levels of the common data lines $CD_1$ and $CD_0$. Thus, the push-pull output circuit makes its output floating in response to the simultaneous conductive conditions of the two MISFETs $Q_{132}$ and $Q_{133}$.

According to the embodiment thus far described, since the load means connected with the digit lines is constructed in the manner shown in FIG. 2, the information stored in the memory cell circuits can be read out at a high speed, as will be described in the following.

The memory cell circuit stores the information with its high load resistors $R_1$ and $R_2$ and its MISFETs $Q_1$ and $Q_2$ if its transmission gate MISFETs $Q_3$ and $Q_4$ are under their nonconductive conditions. Here, the information to be a stored "1" is made to correspond to the MISFET $Q_1$ being nonconductive whereas the MISFET $Q_2$ is conductive. On the other hand, the information to be a stored "0" is made to correspond to the MISFET $Q_1$ being conductive whereas the MISFET $Q_2$ is nonconductive.

When the memory cell circuit $MS_{11}$ is selected to read out the information stored therein, the circuit operations are performed in the manner which follows. Here, it is assumed that the memory cell circuit $MS_{11}$ is stored in advance with the value "1". It is also assumed that the common data lines hold their high levels in their (not-shown) floating capacitors in accordance with their previous conditions.

When the word line $W_1$ is raised to the high level by the action of the X decoder circuit 1, the memory cell circuits $MS_{11}$ to $MS_{1n}$ in the first row are selected so that their transmission gates MISFETs $Q_3$ and $Q_4$ are rendered conductive.

In response to the conductive conditions of the above MISFETs $Q_3$ and $Q_4$, the load means $R_{11}$ and $R_{01}$ of relatively low resistance, which are connected with the digit lines $D1_1$ and $D1_1$, exert their loads upon the MISFETs $Q_1$ and $Q_2$ of the memory cell circuit $MS_{11}$. Since the MISFET $Q_1$ is held under its nonconductive condition in accordance with the information stored in advance, no current flows through the load means $R_{11}$ so that the voltage drop of about $2V_{th}$ at the highest is generated in that load means, as had been explained. As a result, the digit line $D1_1$ takes the high level of $V_{cc}-2V_{th}$. Since, on the contrary, the MISFET $Q_2$ is under its conductive condition, the other load means $R_{01}$ is supplied with the current so that it is subjected to a relatively high voltage drop. As a result, the digit line $D0_1$ takes the low level.

In response to the high level at the output line $C_1$ of the Y decoder circuit 3, the MISFETs $Q_5$ and $Q_6$ of the column gate circuit 4 are rendered conductive so that the signals of the digit lines $D1_1$ and $D0_1$ are transferred to the common data lines $CD_1$ and $CD_0$, respectively.

Figure 9:
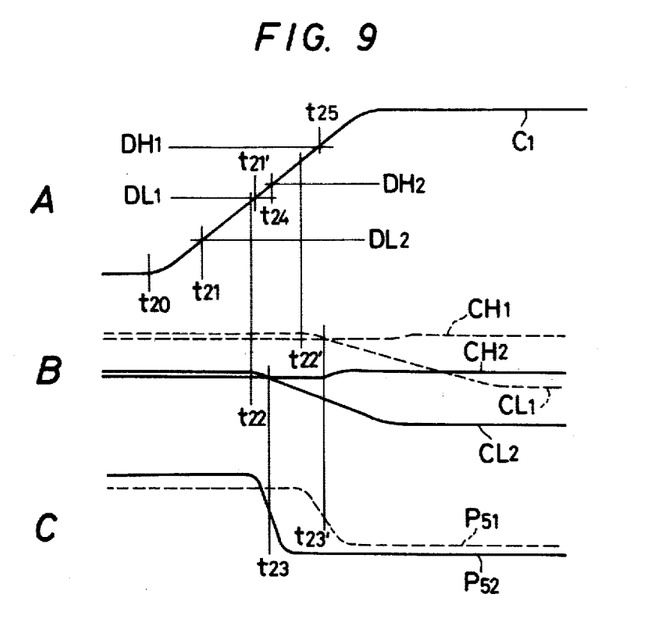
FIGS. 9, A-C, and 10, A and B, are charts showing the operating waveforms of the memory circuit of FIG. 1.

Turning now to FIG. 9A, there are shown relationships among the signal changing characteristics at the output line $C_1$, which is selected by the Y decoder circuit 3, and the signal levels $DH_2$ and $DL_2$ at the digit lines $D1_1$ and $D0_1$, respectively. Incidentally, the output signals of the Y decoder circuit 3 are varied, in accordance with its circuit construction, simultaneously with or slightly faster than the output signals of the X decoder circuit 1. At the operation start of the Y decoder circuit 3, therefore, the signal levels of the digit lines $D1_1$ and $D0_1$ are not always fixed. For the purpose of convenience of explanation, however, the signal levels at the digit lines are shown in FIG. 9A as if they are fixed.

As shown in FIG. 9A, the signals at the output line $C_1$ selected by the Y decoder circuit 3 begin to rise from the low level at time t20 (Incidentally, the signals will be referred to as "signals $C_1$".).

At time t21, the level of the signals $C_1$ reaches the low level $DL_2$ of the digit line $D0_1$.

At time t22, the level of the signals $C_1$ becomes higher by the threshold voltage of the MISFET than the level $DL_2$ of the digit line $D0_1$. As a result, the MISFET $Q_6$ of the column gate circuit 4 begins conducting. Since, in this instance, the digit line $D0_1$ is at the low level whereas the common data lines are at the high levels, the electrode $P_1$ of the MISFET $Q_6$ at the digit line side acts as a source whereas the electrode $P_2$ of the same at the common data line side acts as a drain. As a result, the level of the common data line $CD_0$, which has been held high by the actions of load means $RC_0$ and the (not-shown) floating capacitor, begins to lower to the level of the digit line $D0_1$, as shown in a curve $CL_2$ in FIG. 9B, in response to the commencement of the conductive condition of the MISFET $Q_6$. Incidentally, the level lowering rate of the common data line $CD_0$ is determined by the respective floating capacitances of the common data line $CD_0$ and the digit line $D0_1$ and by the conducting resistance of the MISFET $Q_6$.

The signals $C_1$ reaches the high level of the digit line $D1_1$ at time $t24$ and exceeds it by the threshold voltage $V_{th}$ of the MISFET at time $t25$. As a result, the MISFET $Q_5$ becomes conductive, too. Thus, the level of the common data line $CD_1$ is varied along the curve $CH_2$ shown in FIG. 9B.

The read out circuit 6 responds to the level difference between the common data lines $CD_1$ and $CD_0$. At the nodal point between the source of MISFET $Q_{113}$ and the drain of the MISFET $Q_{114}$, both of which constitute the first stage differential circuit of the read out circuit 6, there appear such signals as have their levels determined substantially at time $t23$ along the curve $P_{52}$ shown in FIG. 9C.

In a case where the enhancement type MISFET $Q_{11}$ is removed from the load means of FIG. 2 to be connected with the digit lines, the high level at the digit line $D1_1$ upon the information reading operation is varied from the level $DH_2$ of FIG. 9A to the level $DH_1$ which is higher than that by the threshold voltage of the MISFET $Q_{11}$. In this instance, the low level at the digit line $D0_1$ will be increased from the level $DL_2$ to the level $DL_1$ of FIG. 9A by the actions of the conductances of the MISFETs $Q_2$ and $Q_4$ under the conductive conditions and the conductance of the load means of memory cell circuit under consideration.

In response to the above rise in the level, the level of the signals $C_1$, at which the MISFETs $Q_5$ and $Q_6$ are rendered conductive, is so increased that the level change of the common data line $CD_0$ is delayed as shown in the broken line $CL_1$ of FIG. 9B so that the level change of the other common data line $CL_1$ is also delayed as shown in the broken line $CH_1$ of the same Figure.

More specifically, the level at the nodal point $P_5$ of the read out circuit 6, as shown in FIG. 8, is changed along the broken line $P_{51}$ of FIG. 9C.

According to the embodiment thus far described, since the load means shown in FIG. 2 is used to lower the level of the digit lines so that the MISFETs $Q_5$ and $Q_6$ of the column gate circuit 4 are rendered conductive from a relatively low level of the signals $C_1$ and since the difference between the level of the digit lines and the level of the signals $C_1$ is so increased that the voltage between the source and gate of the MISFETs $Q_5$ and $Q_6$ is raised together with the conductance therebetween, the data transfer between the digit lines and the common data lines can be accomplished at a high speed.

Figure 11:
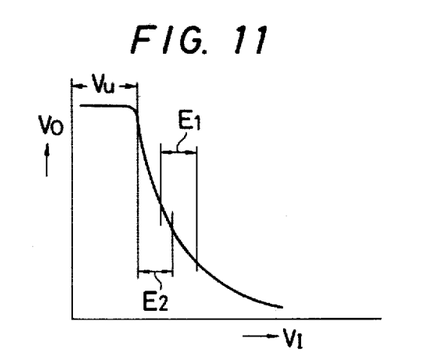
FIG. 11 is a chart showing the characteristic curves of the input vs output of the circuit of FIG. 8.

FIG. 11 shows the characteristics of input voltage $V_I$ vs output voltage $V_0$ of the inverter circuit which is composed of the drive MISFETs and the load MISFETs connected with the drains of the former. The gain of the inverter circuit is increased at a greater rate as the gradient of the characteristic curve becomes the steeper. The MIS inverter circuit can have its gain increased at a greater rate as its input signal level approaches the threshold voltage $V_{th}$ of the drive transistor.

According to the present embodiment, since the levels of the common data lines $CD_1$ and $CD_0$ are lowered by the loads of the digit lines, the read out circuit can be operated with a high gain.

As a result, the read out circuit can also be operated at a high speed according to the present embodiment.

Figures 12, 13:
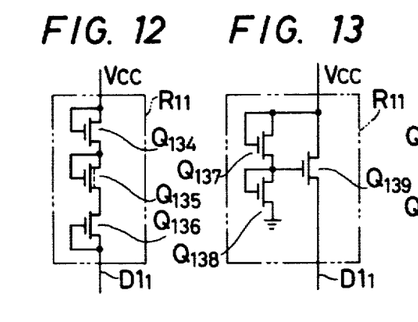
FIGS. 12 to 15 are circuit diagrams showing other embodiments of the present invention, respectively.
Figure 14:
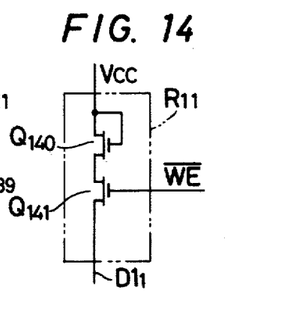

FIGS. 12 to 15 show such modifications as can be used in place of the load means shown in FIG. 2. In the modification of FIG. 12, the MISFET $Q_9$ of FIG. 2 is replaced by a MISFET $Q_{135}$, and the MISFET $Q_{10}$ is replaced by a MISFET $Q_{134}$. In the modification of FIG. 13, the voltage to be fed from the source of MISFET $Q_{139}$ to the digit line $DL_1$ is lowered by means of a voltage dividing circuit which is composed of MISFETs $Q_{137}$ and $Q_{138}$. In the modification of FIG. 14, a MISFET $Q_{141}$ is controlled by the write control signals $\overline{WE}$. The load means establishes the voltage drop of $2V_{th}$ by the actions of the MISFETs $Q_{140}$ and $Q_{141}$ during the reading operation when the write control signals $\overline{WE}$ reach their high level.

Figure 15:
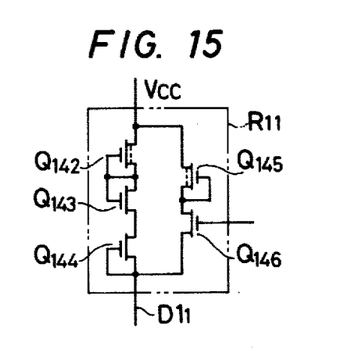

In the modification of FIG. 15, moreover, a series circuit consisting of MISFETs $Q_{142}$ to $Q_{144}$ similar to the MISFETs $Q_9$ to $Q_{11}$ of FIG. 2 is connected in parallel with a series circuit consisting of MISFETs $Q_{145}$ and $Q_{146}$. In the circuit of FIG. 15, the MISFET $Q_{146}$ is controlled by a circuit which is similar to a supply voltage detection circuit 9 to be described later. If the supply voltage becomes lower than the voltage detected by the supply voltage detection circuit 9, the high level signals detected thereby are fed to the gate of the MISFET $Q_{146}$.

In a case where the supply voltage is made higher than the detection level by the switch control of the MISFET $Q_{146}$, the voltage drop of $2V_{th}$ is established by the actions of the MISFETs $Q_{142}$ to $Q_{144}$. If, on the contrary, the supply voltage is lower than the detection level, the voltage drop of $V_{th}$ is established by the action of the MISFET $Q_{146}$. Since, in these ways, the switch control of the MISFET $Q_{146}$ is effected by the supply voltage, the high level of the digit lines is raised when the supply voltage is lowered. As a result, the read out circuit 6 can be supplied with a substantially constant voltage irrespective of the level of the supply voltage. Therefore, if the load means of FIG. 15 is used, the read out circuit 6 can be operated to a sufficient extent even with a relatively low supply voltage.

According to the embodiments thus far described, the common data lines $CD_1$ and $CD_0$ can be placed at the same potential during the chip non-selecting operation and at a level equal to the high level of the digit lines by the actions of the load means $RC_1$ and $RC_0$ and by the actions of a switching circuit 11 which in turn is controlled by a pulse generating circuit 10 made operative upon completion of the chip selecting operation. As a result, the access time of the memory circuit when the chip selecting condition is restored can be shortened. If, on the contrary, the load means $RC_1$ and $RC_0$ and circuit 11 are not connected with the common data lines $CD_1$ and $CD_0$, such a high level is held in one of those data line as has been determined during the previous chip selecting operation by the action of the floating capacitor thereof, whereas a low level is held in the other data line. As a result, under the renewed chip selecting condition, in case the information stored in the memory cell circuit is to be read out, if the stored information has such a level as inverts the levels of the common data lines, one of these common data lines is changed from its high level to its low level whereas the other common data line is changed from its low level to its high level by the actions of that memory cell circuit. As a result, it takes a relatively long time for the potential difference between the paired common data lines to reach such a sufficient level as is required by the read out circuit 6.

Figure 3:
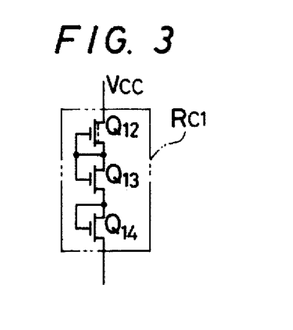
FIG. 3 is a circuit diagram showing in detail the block $RC_1$ of FIG. 1.

Since the load means $RC_1$ and $RC_2$ are made to have an identical construction, the concrete circuit for the load means $RC_1$ is illustrated in FIG. 3. This load means $RC_1$ has the same construction as the load means of FIG. 2 which is connected with the digit lines.

The concrete circuits of the pulse generating circuit 10 and the switching circuit 11 are shown in FIG. 8.

The pulse generating circuit 10 is composed of two inverter circuits respectively consisting of MISFETs $Q_{81}$ and $Q_{82}$ and $Q_{83}$ and $Q_{84}$, a Schmidt circuit consisting of MISFETs $Q_{85}$ to $Q_{88}$, and a two-input NOR gate circuit consisting of MISFETs $Q_{89}$ and $Q_{90}$. The above NOR gate circuit has its one input terminal supplied with the output signals WE3 from the write control circuit 7 of FIG. 7, while being delayed by the two inverter circuits and the Schmidt circuit, and its other input terminal supplied directly with the aforementioned output signals WE3.

Thanks to the circuit construction of FIG. 5, the signals WE3 take their high level during the writing operation and their low level during the chip non-selecting operation and during the reading operation.

If the signals WE3 are at the low level, the gate input to the MISFET $Q_{89}$ takes the high level so that the output WR of the circuit 10 takes the low level. Likewise, in a case where signals WE3 are at the high level, the gate input of the MISFET $Q_{91}$ takes the high level so that the output WR also takes the low level.

The output WR of the pulse generating circuit 10 restores its high level in response to the change of the signals WE3 from the high level to the low level under the nonconductive condition of the MISFET $Q_{91}$ by the time the MISFET $Q_{89}$ is rendered conductive with a delay in the circuit consisting of the MISFETs $Q_{81}$ to $Q_{88}$. The characteristics of these signals WE3 and WR are illustrated in FIG. 4.

On the other hand, the switching circuit 11 is composed of a MISFET $Q_{92}$, which is connected between the power source $V_{cc}$ and one of the common data lines $CD_1$, a MISFET $Q_{93}$, which is connected between the power source $V_{cc}$ and the other common data line $CD_0$, and a MISFET $Q_{94}$ which is connected between the common data lines. These MISFETs $Q_{92}$ to $Q_{94}$ are rendered conductive in response to the high level of the output WR of the pulse generating circuit 10.

Figure 10:
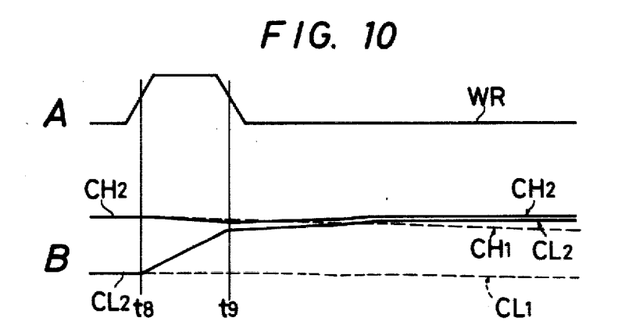

FIG. 10A recites the characteristics of the signals WR shown in FIG. 4, and FIG. 10B shows the changes in the potentials at the paired common data lines. During the chip selecting period prior to time t8, the signals $CH_2$ of one of the common data lines, e.g., $CD_1$ are at the high level whereas the signals $CL_2$ of the other common data line, e.g., $CD_0$ are at the low level.

At the time t8, the respective MISFETs of the switching circuit 11 begin to become conductive in response to the signals WR. The MISFETs $Q_{92}$ and $Q_{93}$ act to raise the potentials of the respective common data lines $CD_1$ and $CD_0$ to the supply level $V_{cc}$. On the other hand, the MISFET $Q_{94}$ acts to reduce the potential difference between the common data lines $CD_1$ and $CD_0$ to zero. The changing rates of the potentials of the common data lines are restricted both by the conductances of the MISFETs $Q_{92}$ and $Q_{94}$ and by the floating capacities of the common data lines.

The times $t_8$ and $t_9$ when the signals WR are raised to the high level are determined by suitably designing the respective MISFETs of the pulse generating circuit 10. As a result, the potentials at the common data lines $CD_1$ and $CD_0$ are raised, as shown in FIG. 10B, to the level which is determined substantially by the load means $RC_1$ and $RC_0$. After the time t9 when the MISFETs $Q_{92}$ to $Q_{94}$ are rendered inconductive, the potentials of the common data lines $CD_1$ and $CD_0$ are maintained by the actions of the load means $RC_1$ and $RC_0$.

In case, incidentally, the chip non-selecting period continues for a relatively long time, the potentials at the common data lines $CD_1$ and $CD_0$ are raised by the load means $RC_1$ and $RC_0$, too, so that the MISFETs $Q_{92}$ and $Q_{93}$ connected between the power source $V_{cc}$ and the common data lines can be dispensed with from the switching circuit 11, if desired. However, the load means $RC_1$ and $RC_0$ act as the load upon the memory cell circuit, which is selected during the reading period, so that their conductances are restricted. Thanks to the provision of these MISFETs $Q_{92}$ and $Q_{93}$, the common data lines $CD_1$ and $CD_0$ can be raised for a relatively short time to the common potential identical to the high level of the digit lines so that the resultant memory circuit can be operated sufficiently even in case the chip non-selecting period is short.

Even with a low supply voltage, according to the embodiment thus far described, the memory cell circuit can continue its storing operation, while preventing its stored information from being lost, as will be described in the following.

Figure 16:
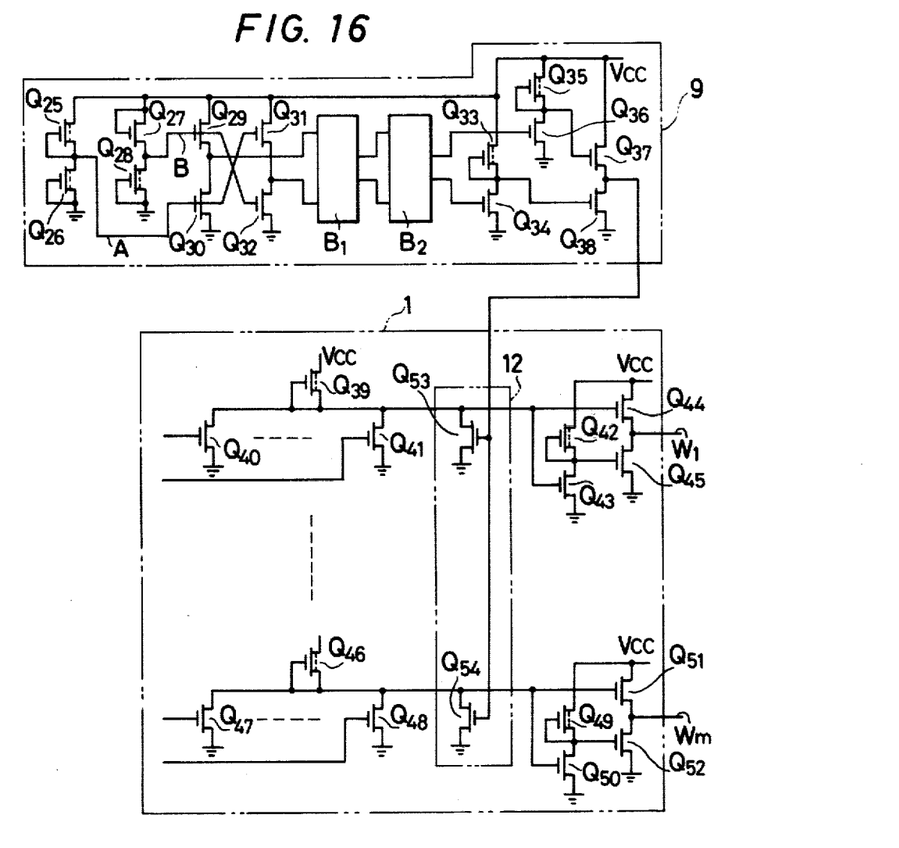
FIG. 16 is a circuit diagram showing in detail the blocks 1 and 9 of FIG. 1.

The concrete circuit of the X decoder circuit 1 of FIG. 1 is constructed in the manner shown in FIG. 16.

In the X decoder circuit 1, as shown, the circuit for selecting the word line $W_1$ is composed of a NOR gate consisting of MISFETs $Q_{39}$ to $Q_{41}$, an inverter circuit consisting of MISFETs $Q_{42}$ and $Q_{43}$, and a push-pull output circuit consisting of MISFETs $Q_{44}$ and $Q_{45}$.

The MISFETs $Q_{40}$ and $Q_{41}$ constituting the NOR gate have their gates supplied with the signals which are selected from the plural address buffer circuits shown in FIG. 7.

In case the word line $W_1$ is to be selected, all the gate inputs of the MISFETs $Q_{40}$ and $Q_{41}$ take their low levels so that the NOR gate as a whole generates high level signals. As a result, high level signals are generated by the push-pull circuit consisting of the MISFETs $Q_{44}$ and $Q_{45}$.

If, on the contrary, the work line $W_1$ is not to be selected, at least one of the gate inputs of the MISFETs $Q_{40}$ and $Q_{41}$ take the high level so that the NOR gate generates the low level signals.

If the supply voltage $V_{cc}$ is lowered, the high levels of the signals of the address buffer circuits $BX_1$ to $BX_6$ are accordingly lowered. In case the reduction in the supply voltage $V_{cc}$ is large, the high level signals of the address buffer circuits $BX_1$ to $BX_6$ cannot be deemed as high for the NOR gate circuit of the X decoder circuit. As a result, although no selection is made, the NOR gate generated the high level signals. In response to this, the push-pull circuit raises the corresponding word line to the high level.

Since, in this instance, the transmission gate MISFETs of the plural memory cell circuits connected with the identical digit line are rendered conductive, the flip-flop circuits of the plural memory cells are coupled to one another through the digit line although this is not desired. In case the memory cell circuits coupled through the digit line bear different contents of information, one memory cell circuit may destroy the information stored in another memory cell circuit.

In the embodiment thus far described, the NOR gate circuit of the X decoder circuit 1 is provided with MISFETs $Q_{53}$ and $Q_{54}$ which are used as additional input terminals. These MISFETs $Q_{53}$ and $Q_{54}$ are rendered conductive by the output of the supply voltage detection circuit 9 in case the supply voltage $V_{cc}$ is lowered to a relatively large extent.

As a result, the push-pull output circuit corresponding to each word line generates the low level signals when the supply voltage is lowered to the relatively large extent. As a result, the aforementioned loss of the information stored in the memory cell circuits can be prevented.

The supply voltage detection circuit 9 is composed, as shown in FIG. 16, of a first voltage dividing circuit consisting of depletion type MISFETs $Q_{25}$ and $Q_{26}$, a second voltage dividing circuit consisting of an enhancement type MISFET $Q_{27}$ and a depletion type MISFET $Q_{28}$, a first differential circuit consisting of MISFETs $Q_{29}$ to $Q_{32}$, second and third differential circuits $B_1$ and $B_2$ having the same construction as the first differential circuit, first and second inverter circuits respectively consisting of MISFETs $Q_{33}$ and $Q_{34}$ and MISFETs $Q_{35}$ and $Q_{36}$, and a push-pull circuit consisting of MISFETs $Q_{37}$ and $Q_{38}$.

Since the first voltage dividing circuit consists of the depression type MISFETs $Q_{25}$ and $Q_{26}$ each having its gate and source connected, it generates the output A of the value which is proportional to the conductance ratio between the MISFETs $Q_{25}$ and $Q_{26}$ and to the supply voltage $V_{cc}$. Since, on the other hand, the second voltage dividing circuit consists of the enhancement type MISFET $Q_{27}$ having its gate and drain connected and the depletion type MISFET $Q_{28}$ having its gate and source connected, it generates the output B of the value which is proportional to the conductance ratio in between the supply voltage $V_{cc}$ higher than the threshold voltage of $V_{th}$ of the MISFET $Q_{27}$.

Figure 17:
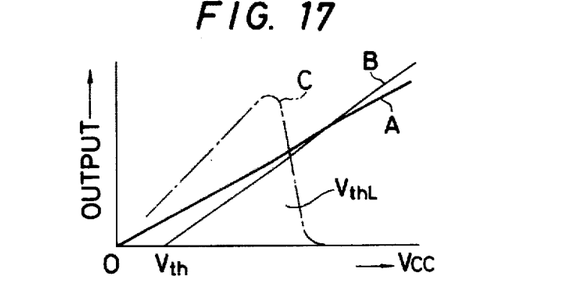
FIG. 17 is a chart showing the characteristic curves of the circuit of FIG. 16.

By suitably accomplishing the mutual designs of the MISFETs $Q_{25}$ and $Q_{26}$ and the MISFETs $Q_{27}$ and $Q_{28}$, the output B can be made higher than the output A at a voltage higher than a preset supply voltage, and vice versa at a voltage lower than the present supply voltage, as will be understood from FIG. 17.

If, in the supply voltage detection circuit 9 of FIG. 16, the supply voltage $V_{cc}$ is higher than the aforementioned preset voltage, the inverter circuit (of $Q_{33}$ and $Q_{34}$) is at the high level whereas the other inverter circuit (of $Q_{35}$ and $Q_{36}$) is at the low level so that the output of the push-pull output circuit (of $Q_{37}$ and $Q_{38}$) takes the low level, as shown in curve C of FIG. 17. On the contrary, when the supply voltage $V_{cc}$ becomes lower than the preset voltage, the push-pull output circuit takes the high level. When the supply voltage $V_{cc}$ becomes further lowered, the output of the same output circuit is lowered together with the supply voltage $V_{cc}$. In response to the output being higher than the threshold voltage $V_{thL}$, the MISFETs $Q_{53}$ and $Q_{54}$ are rendered conductive.

In the supply voltage detection circuit shown in FIG. 16, the differential voltage between the two voltage dividing circuits can be changed in any desirable manner in accordance with the conductance ratio between the MISFETs of series connection. By establishing such differential voltage, an amplifier circuit consisting the MISFETs $Q_{29}$ to $Q_{32}$ can be used so that high sensitivity can be exhibited.

It should be understood here that the present invention be not limited to the embodiments thus far described. As the load means connected with the digit lines, for example, there can be used the load means of FIG. 15, which can be controlled by another voltage detecting circuit having its detection voltage raised to a higher level than the voltage detection circuit 9 shown in FIG. 19. According to this example, when the level at the digit lines is lowered to such an extent that it cannot ensure the operations of the read out circuit, the load means connected with the digit lines is controlled to raise the level at the digit lines. Moreover, when the supply voltage is lowered to such an extent that it cannot ensure the operations of the X decoder circuit 1, these operations can be interrupted.

What is claimed is:

1. A memory circuit comprising:
   a memory cell circuit having a selecting terminal and input and output terminals;
   a digit line with which the input and output terminals of said memory cell circuit are connected;
   load means connected with said digit line;
   a decoder circuit; and
   switching means controlled in response to the output signals of said decoder circuit for coupling said digit line to a data line,
   said load means including a plurality of enhancement mode insulated gate field effect transistors connected in series in a diode form.

2. A memory circuit according to claim 1, wherein said switching means includes an enhancement mode insulated gate field effect transistor.

3. A memory circuit according to claim 1, wherein said load means further includes a depletion mode insulated gate field effect transistor connected in series with said insulated gate field effect transistor and having its gate and source connected.

4. A memory circuit according to claim 1, wherein said load means including a plurality of enhancement mode insulated gate field effect transistors connected in series in the diode form is connected with said data line.

5. A memory circuit according to claim 1, wherein an insulated gate field effect transistor to be rendered conductive upon non-selection of a memory is connected between said data line and a supply terminal.

6. A memory circuit comprising:
   a memory cell circuit having a selecting terminal and input and output terminals;
   a digit line with which the input and output terminals of said memory cell circuit are connected;
   load means connected with said digit line;
   a decoder circuit; and
   switching means controlled in response to the output signals of said decoder circuit for coupling said digit line to a data line.
   said load means including an enhancement mode insulated gate field effect transistor having its gate receptive of a bias voltage lower than a supply voltage.

7. A memory circuit comprising:
   a memory cell circuit having a selecting terminal and input and output terminals;
   a digit line with which the input and output terminals of said memory cell circuit are connected;

load means connected with said digit line;

a decoder circuit; and switching means controlled in response to the output signals of said decoder circuit for coupling said digit line to a data line, said load means including a first enhancement mode insulated gate field effect transistor of diode connection, and a second enhancement mode insulated gate field effect transistor connected in series with the first insulated gate field effect transistor for being subjected to switching control in accordance with differing control signals.

8. A memory circuit comprising:

a memory cell circuit having a selecting terminal and input and output terminals;

a digit line with which the input and output terminals of said memory cell circuit are connected;

load means connected with said digit line;

a decoder circuit;

switching means controlled in response to the output signals of said decoder circuit for coupling said digit line to a data line; and a supply voltage detection circuit for detecting a supply voltage which is lowered to a preset level, said load means including a first circuit having a plurality of enhancement mode insulated gate field effect transistors connected in series in a diode form, and a second circuit connected in parallel with the first circuit and having an enhancement mode insulated gate field effect transistor which is rendered conductive by the supply voltage lower than said preset level in response to the output signals of said supply voltage detection circuit at the gate thereof.

* * * * *